(12) United States Patent
Carter et al.

(10) Patent No.: US 8,205,666 B2
(45) Date of Patent: Jun. 26, 2012

(54) HEAT SINKS AND METHOD OF FORMATION

(75) Inventors: Daniel P. Carter, Bainbridge Island, WA (US); Michael T. Crocker, Tacoma, WA (US); Ben M. Broili, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 12/761,152

(22) Filed: Apr. 15, 2010

(65) Prior Publication Data

US 2010/0193173 A1  Aug. 5, 2010

Related U.S. Application Data

(60) Division of application No. 11/637,933, filed on Dec. 13, 2006, now abandoned, which is a continuation of application No. 10/963,556, filed on Oct. 14, 2004, now abandoned, which is a continuation of application No. 10/047,101, filed on Jan. 17, 2002, now abandoned.

(51) Int. Cl.
*F28F 7/00* (2006.01)
*H05K 7/20* (2006.01)

(52) U.S. Cl. ................................ 165/80.3; 165/185

(58) Field of Classification Search ............... 165/80.3, 165/185, 122, 104.34, 104.21; 361/695, 361/697, 704, 700; 174/15.2, 16.3
See application file for complete search history.

(56) References Cited

U.S. PATENT DOCUMENTS

| | | | |
|---|---|---|---|
| 2,289,984 A | 7/1942 | Mouromtseff et al. | |
| 2,434,676 A * | 1/1948 | Spender | 165/182 |
| 5,523,918 A | 6/1996 | Chiou | |
| 5,661,638 A | 8/1997 | Mira | |
| 5,785,116 A | 7/1998 | Wagner | |
| 5,954,124 A | 9/1999 | Moribe et al. | |
| 5,975,194 A | 11/1999 | Wagner | |
| 6,028,771 A | 2/2000 | Wong et al. | |
| 6,101,093 A | 8/2000 | Wong et al. | |
| 6,101,096 A | 8/2000 | MacGregor et al. | |
| 6,159,031 A | 12/2000 | Llapitan et al. | |
| 6,179,046 B1 | 1/2001 | Hwang et al. | |
| 6,330,908 B1 | 12/2001 | Lee et al. | |
| 6,367,542 B1 | 4/2002 | Chen | |
| 6,404,634 B1 | 6/2002 | Mann | |
| 6,419,007 B1 | 7/2002 | Ogawara et al. | |
| 6,466,444 B2 | 10/2002 | Cheung | |
| 6,519,150 B1 * | 2/2003 | Chen et al. | 361/697 |
| 6,525,939 B2 | 2/2003 | Liang et al. | |
| 6,538,888 B1 * | 3/2003 | Wei et al. | 361/697 |
| 6,552,902 B2 | 4/2003 | Cho et al. | |
| 6,633,484 B1 * | 10/2003 | Lee et al. | 361/697 |
| 6,640,882 B2 | 11/2003 | Dowdy et al. | |
| 6,671,172 B2 | 12/2003 | Carter et al. | |
| 2001/0010264 A1 * | 8/2001 | Kuo | 165/185 |
| 2001/0055199 A1 * | 12/2001 | Cheung | 361/709 |
| 2002/0017378 A1 * | 2/2002 | Hu | 165/80.3 |
| 2002/0033249 A1 | 3/2002 | Chuang | |
| 2002/0046826 A1 * | 4/2002 | Kao | 165/104.33 |
| 2003/0048612 A1 * | 3/2003 | Carter et al. | 361/718 |
| 2003/0063439 A1 | 4/2003 | Wei et al. | |

\* cited by examiner

*Primary Examiner* — Tho V Duong
(74) *Attorney, Agent, or Firm* — Kenyon & Kenyon LLP

(57) ABSTRACT

A heat sink (and method of forming a heat sink) is provided that includes a core having a central axis and a plurality of cooling fins arranged about the core. Each fin has a base and a tip. The fins may be shaped to capture a tangential component of air from the fan. At least one portion (such as upper portion) of the fins may be bent. A lower portion of each fin may also be bent.

8 Claims, 17 Drawing Sheets

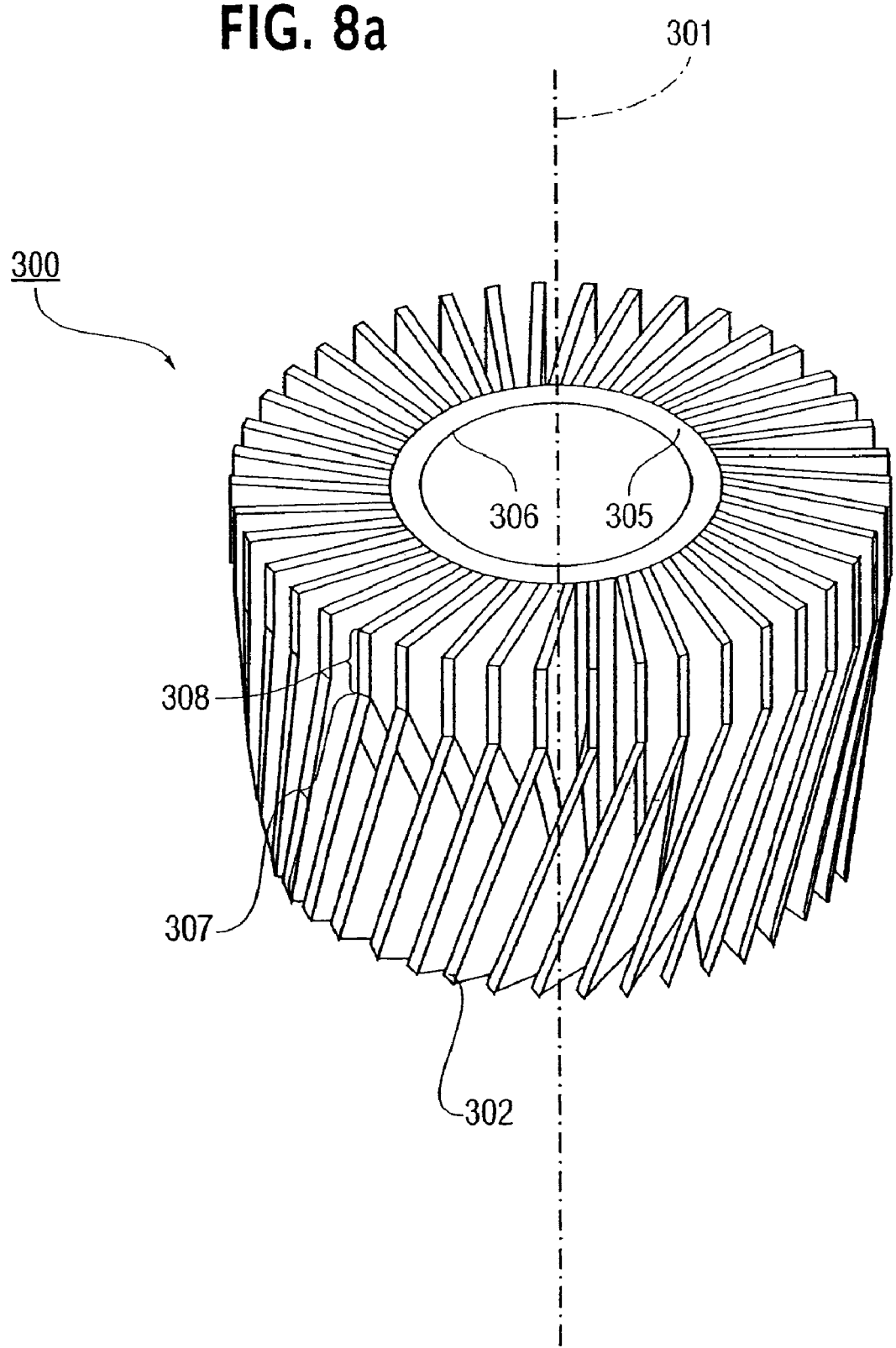

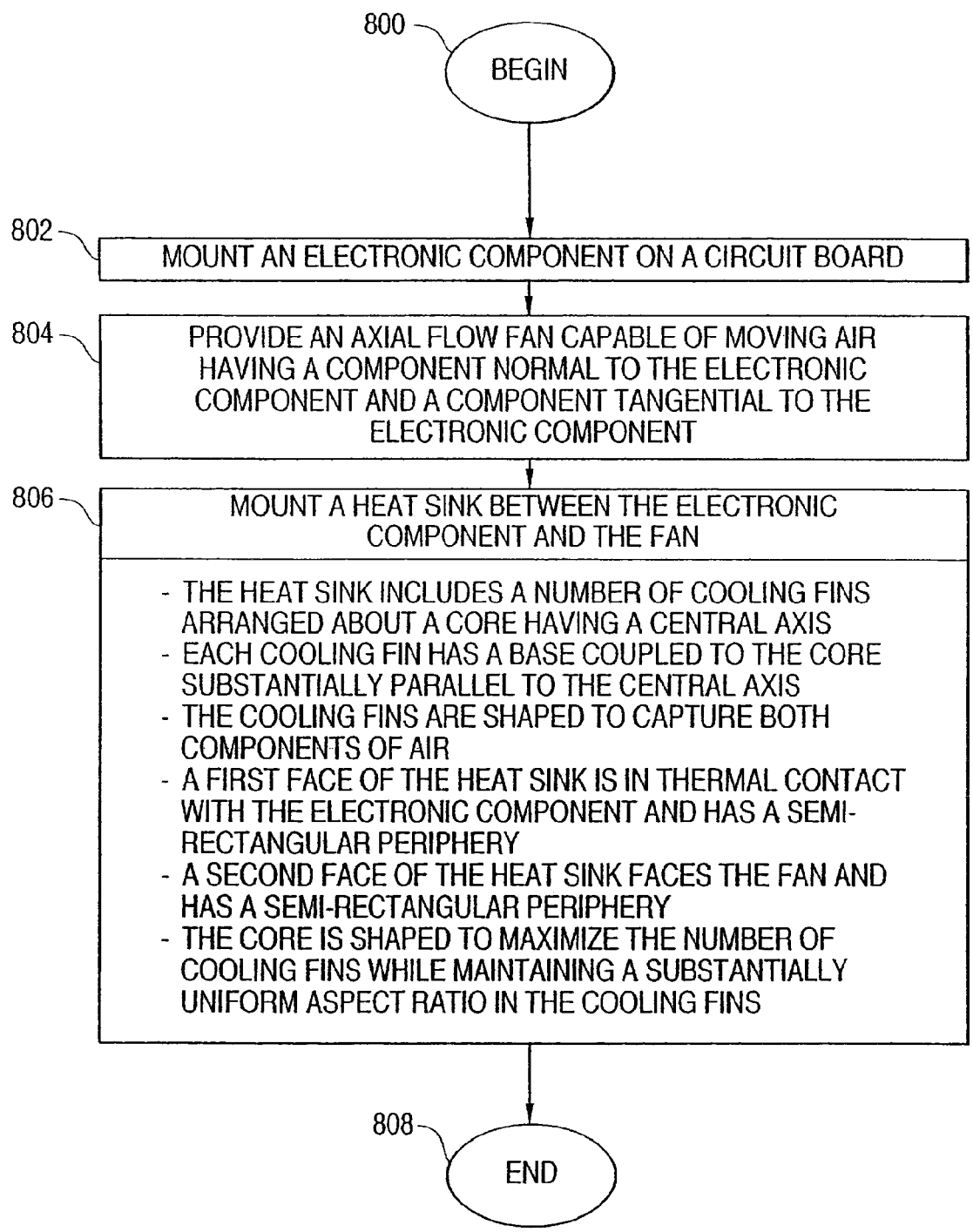

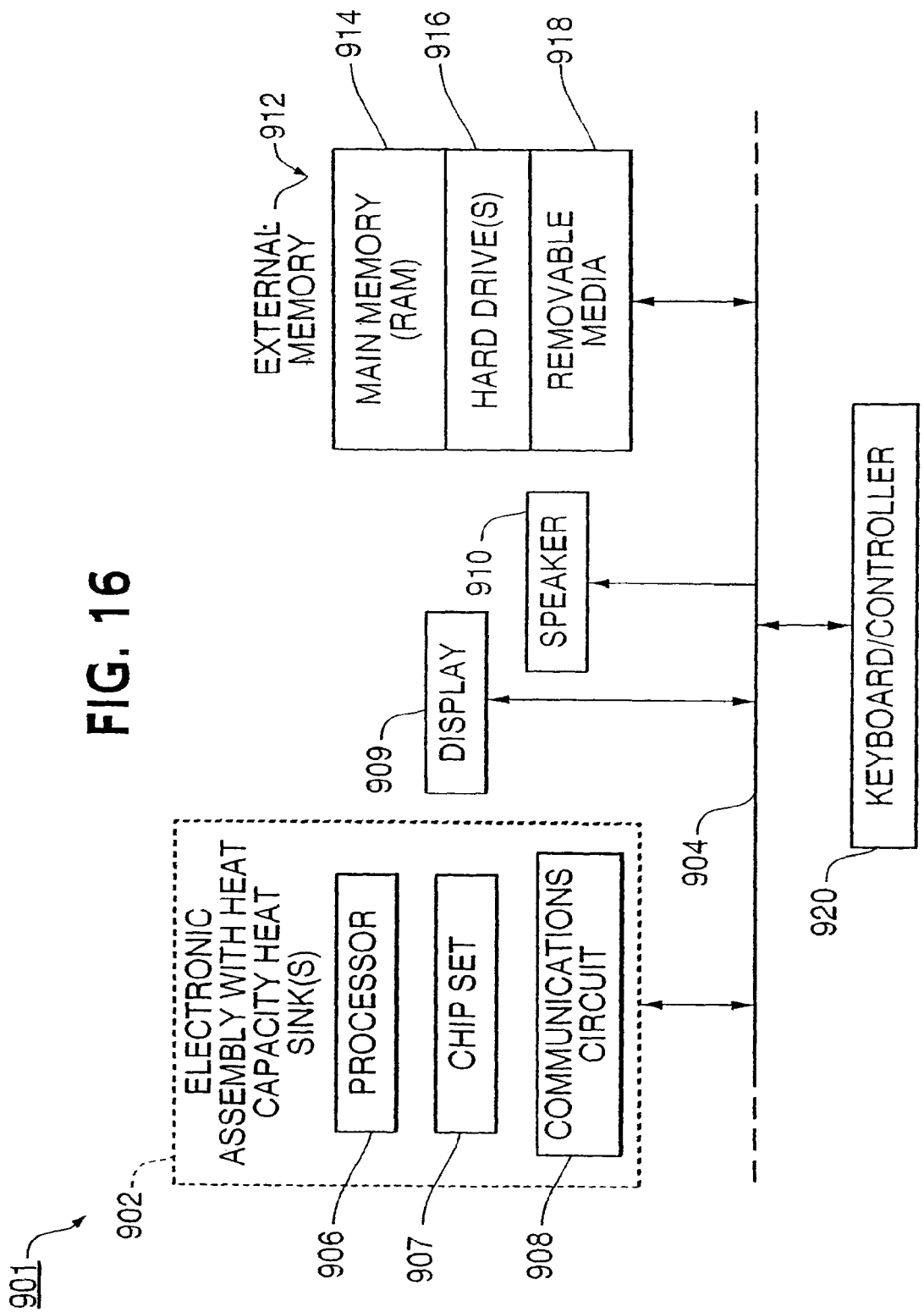

HEAT SINKS AND METHOD OF FORMATION

This application is a divisional application of U.S. patent application Ser. No. 11/637,933, filed Dec. 13, 2006, which is a continuation of U.S. patent application Ser. No. 10/963,556, filed Oct. 14, 2004, now abandoned, which is a continuation of U.S. patent application Ser. No. 10/047,101, filed Jan. 17, 2002, which is now abandoned.

FIELD

The present invention is directed to a heat sink for an electronic assembly.

BACKGROUND

Electronic components, such as integrated circuits (ICs), are typically assembled into packages by physically and electrically coupling them to a substrate, such as a printed circuit board (PCB), to form an "electronic assembly". The "electronic assembly" can be part of an "electronic system". An "electronic system" is broadly defined herein as any product including an "electronic assembly". Examples of electronic systems include computers (e.g., desktop, laptop, hand-held, server, Internet appliance, etc.), wireless communications devices (e.g., cellular phones, cordless is phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs on substrates where each new generation of packaging must provide increased performance, particularly in terms of an increased number of components and higher clock frequencies, while generally being smaller or more compact in size.

As the internal circuitry of ICs, such as processors, operates at higher and higher clock frequencies, and as ICs operate at higher and higher power levels, the amount of heat generated by such ICs can increase their operating temperature to unacceptable levels, degrading their performance or even causing catastrophic failure. Thus it becomes increasingly important to adequately dissipate heat from IC environments including IC packages.

For this reason, electronic equipment often contains heat dissipation equipment to cool high-performance ICs. One known type of heat dissipation equipment includes an impinging fan mounted atop a heat sink. The heat sink includes a plurality of radial fins or rods formed of a heat-conductive material such as copper or aluminum formed around a core. The bottom surface of the core is in thermal contact with the IC to conduct heat from the IC to ambient air. The fan moves air over the fins or rods to enhance the cooling capacity of the heat dissipation equipment. However, with high-performance ICs consuming ever-greater amounts of power and accordingly producing greater amounts of heat, heat dissipation equipment must have higher heat dissipation capability than that heretofore obtained.

In order to offer higher capacity heat transfer, it is difficult for air-cooled heat sinks to grow in is size because equipment manufacturers are under tremendous competitive pressure to maintain or diminish the size of their equipment packages, all the while filling them with more and more components. Thus, competitive heat dissipation equipment must be relatively compact in size and must perform at levels sufficient to prevent high-performance components from exceeding their operational heat specifications.

For the reasons stated above, and for other reasons stated below that will become apparent to those skilled in the art upon reading and understanding the present specification, there is a significant need in the art for apparatus and methods for packaging high-performance electronic components in an electronic assembly that minimize heat dissipation problems.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein:

FIG. 8a illustrates a perspective view of a swept-bent fin heat sink according to an example embodiment of the present invention;

FIG. 15 illustrates a flow diagram of a method of fabricating an electronic assembly according to an example embodiment of the present invention; and FIG. 16 is a block diagram of an electronic system incorporating at least one electronic assembly with at least one heat sink according to an example embodiment of the present invention.

DETAILED DESCRIPTION

In the following detailed description, reference is made to the accompanying drawings, which form a part hereof, and in which is shown by way of illustration specific arrangements and preferred embodiments in which the inventions may be practiced. These arrangements and embodiments are described in sufficient detail to enable those skilled in the art to practice the invention, and it is to be understood that other embodiments may be utilized and that structural, mechanical, compositional, and procedural changes may be made without departing from the spirit and scope of the present inventions. The following detailed description is, therefore, not to be taken in a limiting sense, and the scope of the present invention is defined only by the appended claims.

Embodiments of the present invention may provide a solution to thermal dissipation problems that are associated with packaging of integrated circuits that have high circuit density and that operate at high clock speeds and high power levels by employing a high capacity heat sink.

A heat sink may include a thermally conductive core. The core may have a number of thermally conductive fins projecting from it. The core may have a central cavity into which a thermally conductive material is inserted. The heat sink fins can be formed in various shapes. The heat sink may be used in an electronic assembly having an impinging fan (e.g. an axial flow fan) directing air onto an upper face of the heat sink. The lower face of the heat sink may be in thermal contact with a heat-generating electronic component such as a high performance IC. The heat sink is structured to capture air from the fan and to direct the air to optimize heat transfer from the heat sink.

Figure 1:
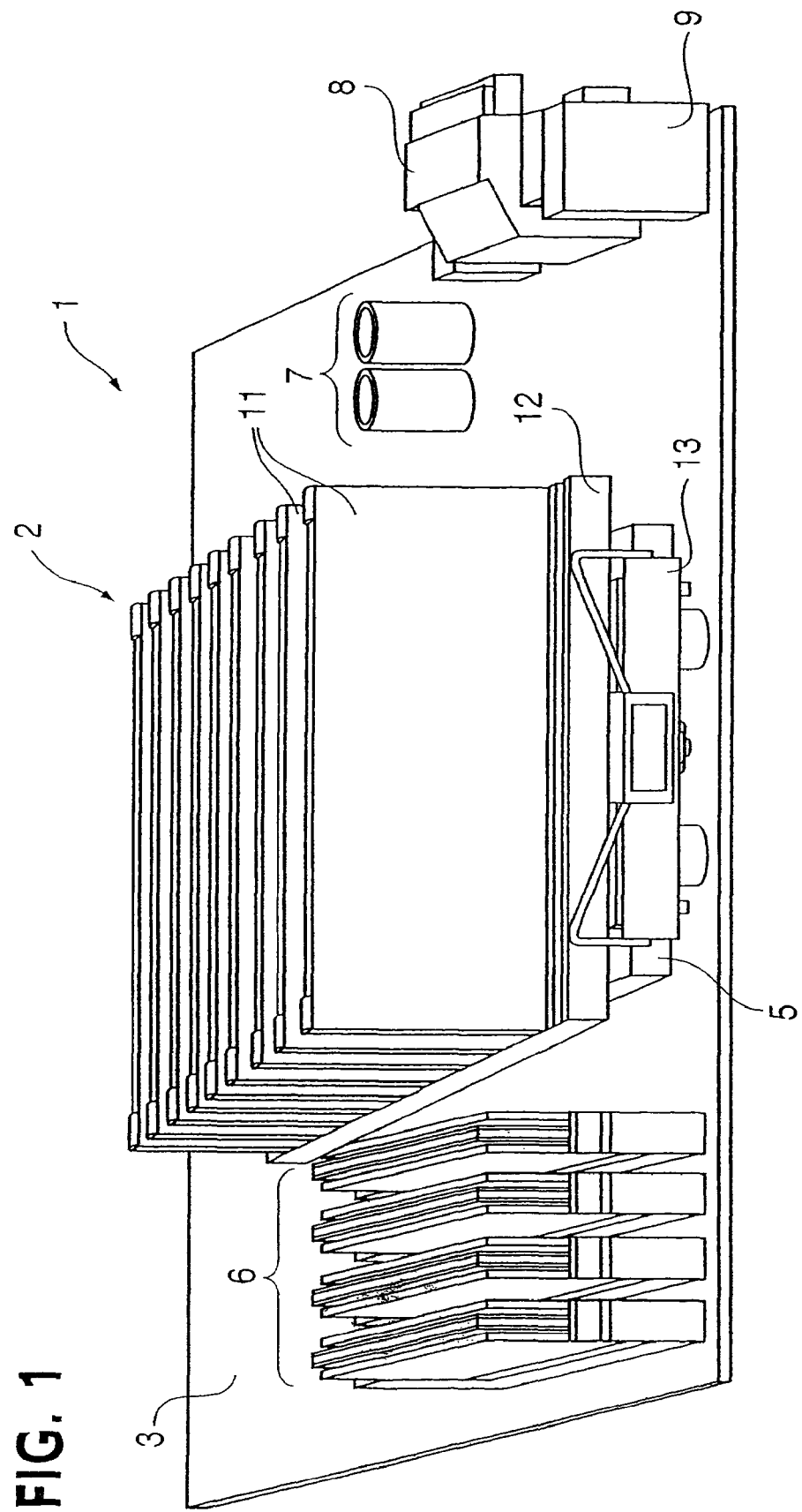
FIG. 1 is a perspective view of an electronic assembly including a heat sink attached to an IC package.

FIG. 1 is a perspective view of an electronic assembly 1 including a heat sink 2 attached to an IC package 5 according to one arrangement. Other arrangements are also possible. The electronic assembly 1 includes a plurality of electronic components 5-9 mounted upon a printed circuit board (PCB) 3. The heat sink 2 may include a relatively thick, flat base plate 12 and an array of fins 11 extending to the edge of and substantially perpendicular to the base plate 12. Although the fins 11 shown in FIG. 1 are folded fins, other heat sinks may not have folded fins. For example, fins may be brazed, machined, or extruded. A base plate 12 may be clamped to the IC package 5 through an attachment device 13. The base plate 12 may be formed of solid copper, and it may contribute a significant amount of cost and mass to the electronic assembly 1.

While the sizes of packaged, high performance ICs are decreasing, the amount of heat generated by these components per unit volume is increasing. Increasing the heat dissipation capabilities of the heat sink 2 may require enlarging the surface area of the base plate 12 and/or the array of the fins 11. This in turn may result in consuming more PCB real estate, which is generally not a viable option in an environment where system packaging densities are increasing with each successive, higher performance, product generation.

The heat sink 2 illustrated in FIG. 1 may be used in conjunction with an axial flow fan (not shown in FIG. 1) to increase heat dissipation from the array of fins 11. An axial flow fan has a spinning impeller that is generally shaped like an airfoil. One component of the air flow emanating from an axial flow fan moves parallel to the axis about which the impeller rotates, and this "axial component" is directed normal to the array of fins 11 of the heat sink 2 (i.e., perpendicular to the PCB 3).

Another component of the airflow from an axial flow fan is tangential to the impeller's direction of rotation. This "tangential component" results in air swirling about the impeller's axis of rotation. The ratio of air being moved by the axial component versus the tangential component varies with the particular fan blade geometry. For example, low angles of attack in the fan blade generally result in a higher ratio of axial flow, while high angles of attack generally result in a higher ratio of tangential flow. In some axial flow fans, the ratio is 1:1.

When an axial flow fan is mounted facing downward on the heat sink 2, its axial component of airflow may provide substantially all of the cooling effect because very little of the tangential component of airflow is captured by the straight vertical fins 11.

Figure 2:
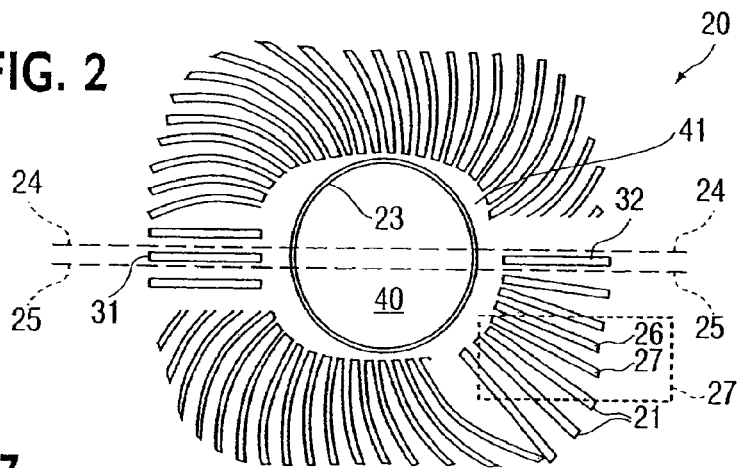
FIG. 2 is a top view of a radial fin heat sink.

FIG. 2 is a top view of a radial fin heat sink 20 according to one arrangement. Other arrangements are also possible. The heat sink 20 is referred to as a "radial fin heat sink" because its fins 21 emanate radially from a central core 41. The fins 21 are substantially straight, and the base of each fin 21 is attached to the core 41 parallel to a central axis 42 (refer to FIG. 4). The core 41 may have a central cavity 23, and a thermal plug 40 of thermally conductive material may reside within the cavity 23 to enhance thermal dissipation.

Figure 3:
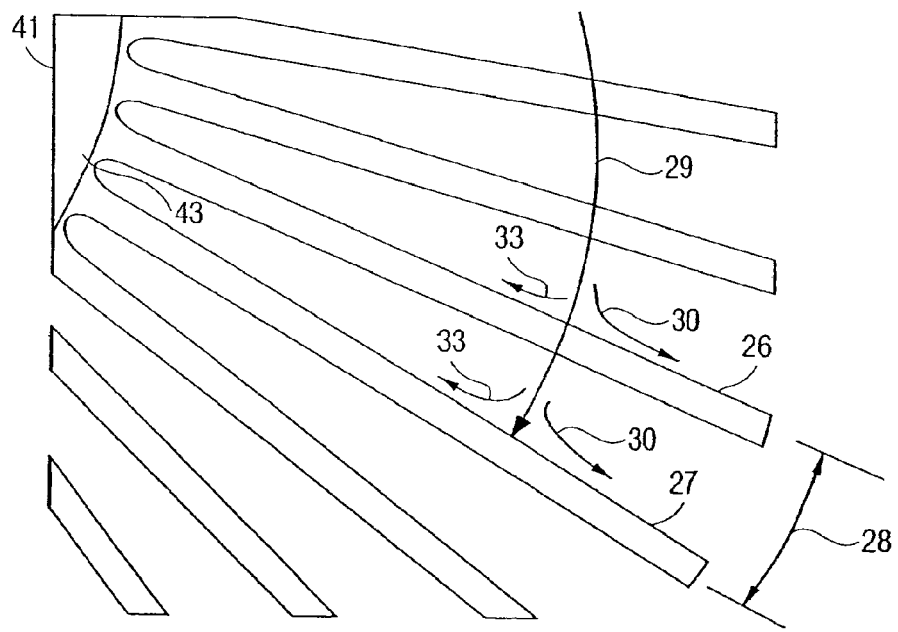
FIG. 3 is a top view of a portion of FIG. 2 showing an airflow pattern within fins of a radial fin heat sink.

FIG. 3 is a top view of the portion within dashed rectangle 22 of FIG. 2 showing an airflow pattern within fins of the radial fin heat sink 20 shown in FIG. 2. In FIG. 3, a tangential air flow component 29 from an axial flow fan (not shown) impinges upon fins 26 and 27.

Before discussing tangential air flow component 29, it should be first noted that the fins 26 and 27 are substantially perpendicular to the core 41, and that fins 26 and 27 diverge considerably as they emanate from the core 41. A radius 43 at the base of the fins 26 and 27 is substantially smaller than fin tip distance 28 at the tips of the fins 26 and 27.

The tangential airflow component 29 may impinge against the fins of the radial fin heat sink 20 such as the fins 26 and 27. A major portion 30 of the tangential air flow component 29 moves outwardly towards the tips of the fins 26 and 27. A smaller portion 33 of the tangential airflow component 29 moves inwardly towards the bases of the fins 26 and 27.

Due to the diverging geometry of the fins 26 and 27, air flow from the tangential component 29, as well as air flow from the axial component, moves towards the fin tips to escape the region between adjacent fins 26 and 27, and thus little air flow reaches the hottest part of the fins 26 and 27 near the core 41. This results in inefficient thermal dissipation. Consequently, a more powerful and noisier fan must be substituted, or the electronic component will not be sufficiently cooled to avoid performance degradation or catastrophic failure.

Figure 4:
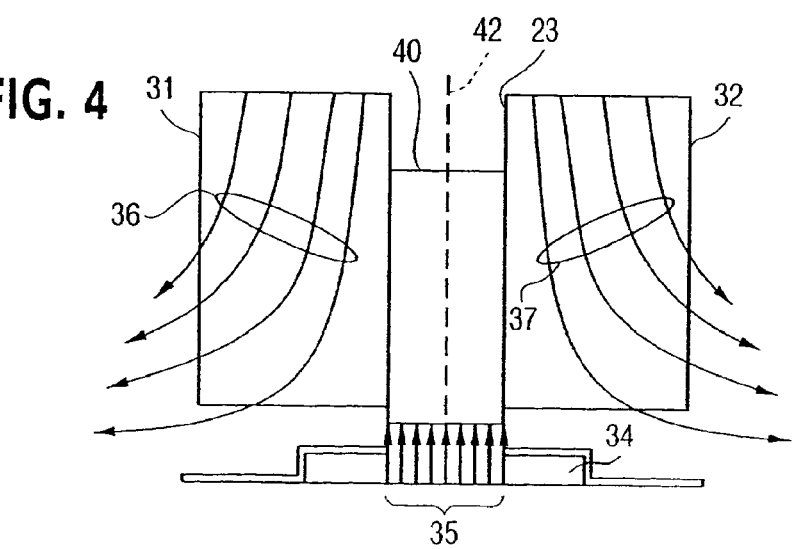
FIG. 4 is a side view of a section of a radial fin heat sink positioned upon an IC package.

FIG. 4 is a side view of a section taken between dashed line segments 24 and 25 of FIG. 2 of the radial fin heat sink 20 positioned upon an IC package 34. The fins 31 and 32 are on opposite sides of the heat sink 20. The lower surface of the thermal plug 40 is in thermal contact with the upper surface of a heat-producing IC package 34. Heat is transferred from the IC package 34 into the thermal plug 40. From the thermal plug 40, heat is transferred through sidewall 38 of the cavity 23 to the fin 31 (the heat sink core has been omitted to simplify this illustration), and through sidewall 39 of the cavity 23 to the fin 32. The hottest part of the fins 31 and 32 is nearest the thermal plug 40.

A group 36 of air flow vectors is schematically shown to represent an axial air flow component produced by an axial flow fan (not shown) downward between adjacent fins, including the fin 31 of the radial fin heat sink 20. It will be seen that little if any airflow moves against the hottest part of the fin 31 nearest the thermal plug 40.

Likewise, another group 37 of airflow vectors represents an axial airflow component produced is by the axial flow fan (not shown) downward between adjacent fins including the fin 32. Again, little if any airflow moves against the hottest part of the fin 32 nearest the thermal plug 40.

In addition, it is not readily apparent from FIGS. 3 and 4, but only an insubstantial amount of airflow from the tangential component produced by a typical axial flow fan is captured by the radial fin heat sink.

It should be apparent that what is needed is a heat sink structure that significantly increases the amount of air impinging upon the hottest part of the heat sink, and that significantly increases the volume and velocity of air moving through the heat sink fins, including significantly increasing the amount of the tangential component of an axial flow fan that is captured by the heat sink.

Figure 5:
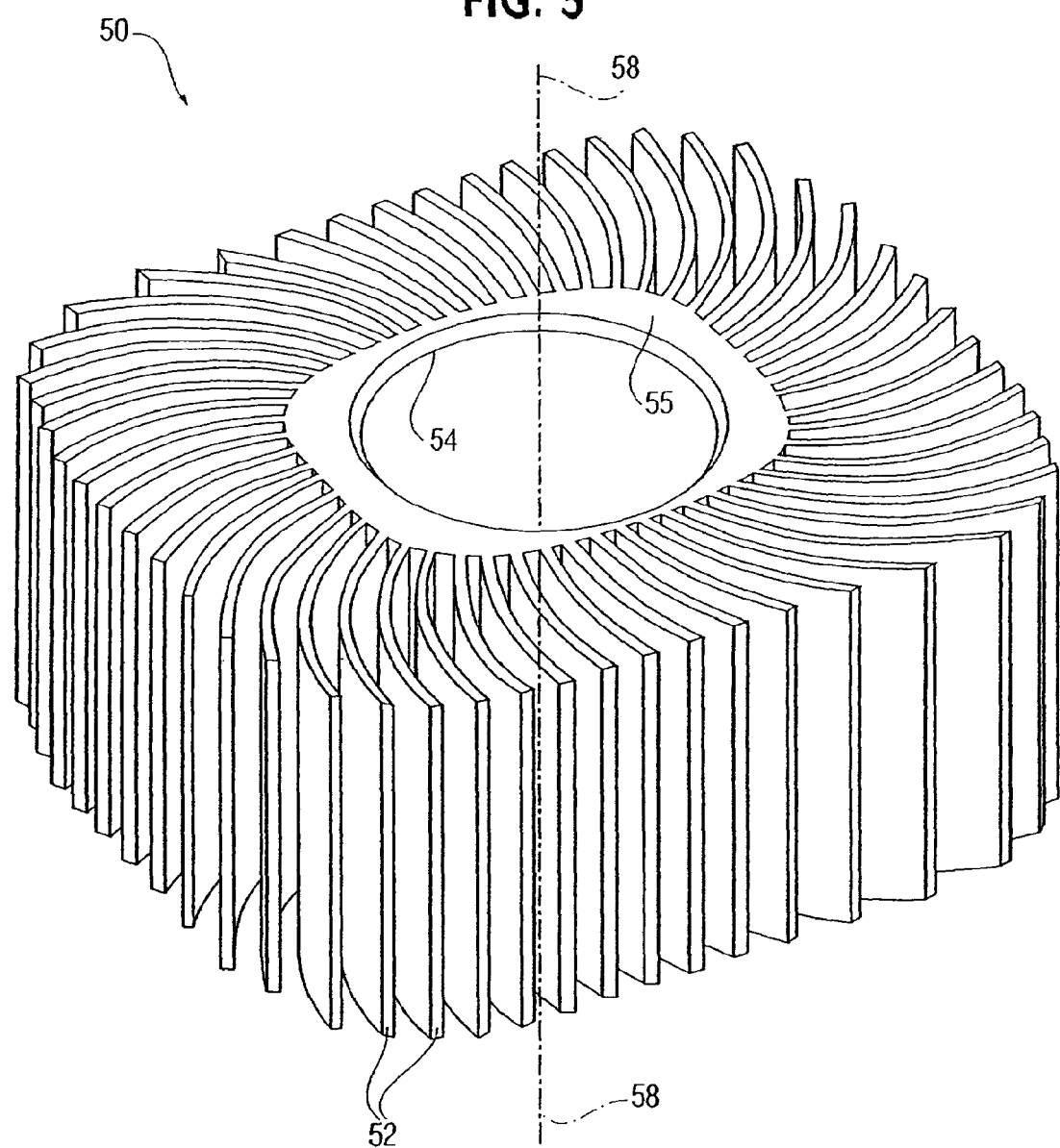
FIG. 5 illustrates a perspective view of a curved fin heat sink.

FIG. 5 illustrates a perspective view of a curved fin heat sink 50 according to one arrangement. Other arrangements are also possible. The curved fin heat sink 50 includes a plurality of cooling fins 52 arranged about a core 55. The fins 52 are formed of a material having high thermal conductivity such as a thermally conductive metal. The fins 52 may be formed of aluminum; however, they may also be formed of copper or any other suitable thermally conductive metal or metal alloy.

The core 55 may have a central axis 58. The core 55 may have a central cavity 54 for insertion of a thermal plug (not shown). Each fin 52 has a base and a tip. The base of each fin 52 is coupled to the core 55 substantially parallel to the central axis 58. Each fin 52 is curved in the same relative direction. The fins 52 of the curved fin heat sink 50 may be shaped to capture the tangential component of air from an axial flow fan (not shown in FIG. 5). The fins 52 may also be shaped to direct a relatively large volume and relatively high velocity of air flow to substantially the entire surface of each fin 52, including the hottest portion of each fin 52 adjacent the core 55.

The fins 52 may be fabricated through an extrusion process. By using an extrusion process, heat sinks can be made at a significant savings in manufacturing costs as compared with a process, for example, in which fins are machined from a heat sink core, or brazed or soldered onto a heat sink core. Using high volume manufacturing techniques, extrusions several feet long may be quickly formed and then cut into individual curved fin heat sinks each having a plurality of curved fins and, optionally if desired, a central cavity to accommodate a thermal plug.

However, the extrusion process for curved fins may be subject to several process constraints. One constraint is that for extruding aluminum, for example, the aspect ratio of a curved fin 52 (i.e., the ratio of the length of a fin 52 to its average width) cannot exceed about 10:1 to 12:1. Another constraint is that the radius at the base of the fins cannot be less than about 1.0 to 1.2 millimeters.

Yet another constraint may be to provide as many fins 52 as possible with each fin 52 as long as possible in order to provide as great a total heat dissipation surface as possible. In the situation where the heat sink is being used to cool an IC, the heat dissipation from the heat sink must be at least sufficient to maintain a junction temperature within the IC at or below a predetermined maximum value.

In view of the above-mentioned process constraints, the core 55 may be shaped to substantially match the shape or footprint of the curved fin heat sink 50, which may be a semi-rectangular shape.

Figure 6:
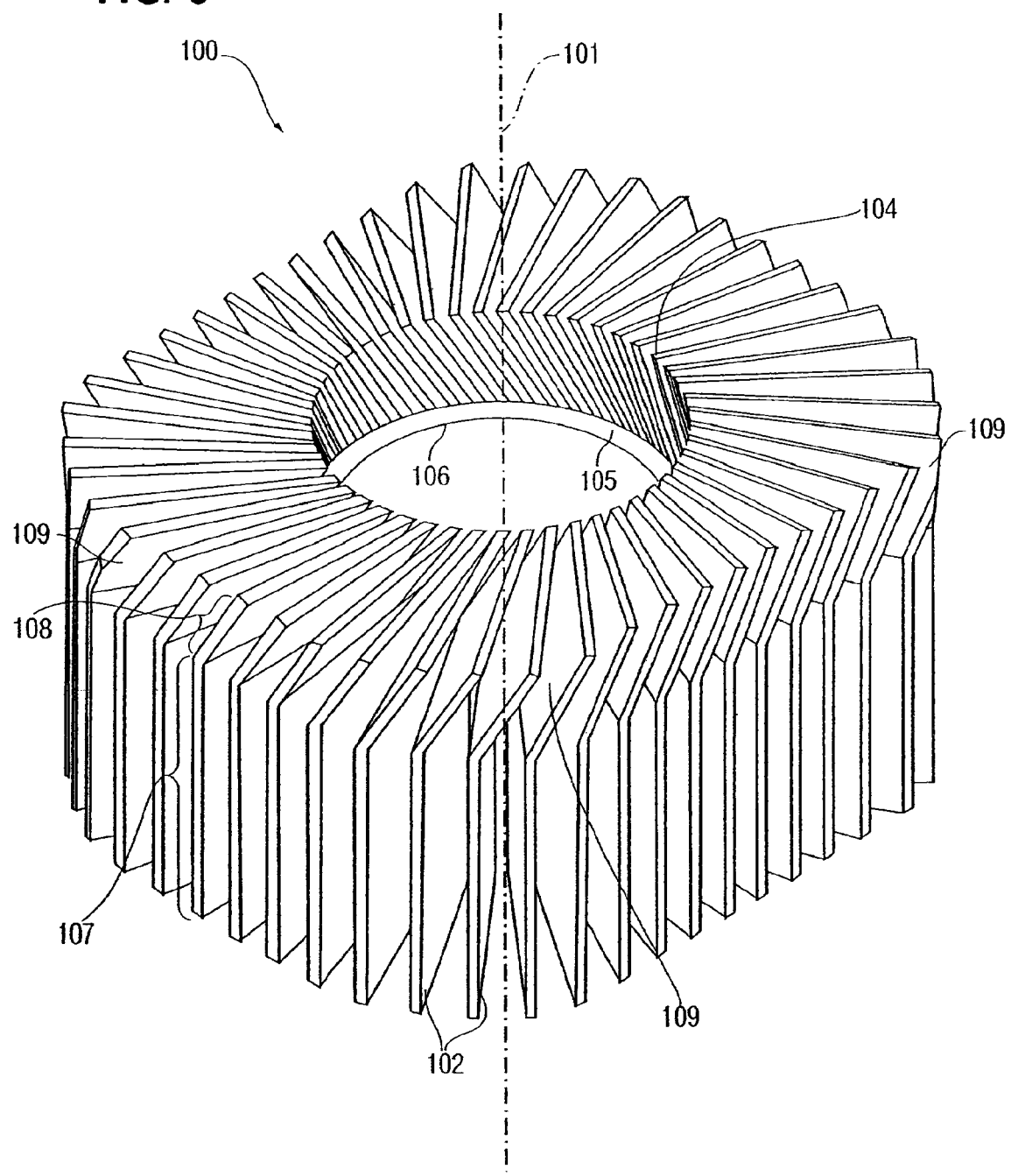
FIG. 6 illustrates a perspective view of a bent fin heat sink.

FIG. 6 illustrates a perspective view of a bent fin heat sink 100 according to one arrangement. Other arrangements are also possible. The bent fin heat sink 100 includes a plurality of cooling fins 102 arranged about a core 105. The fins 102 are formed of a thermally conductive metal. The fins 102 may be formed of aluminum; however, the fins 102 may also be formed of copper or any other suitable thermally conductive metal or metal alloy.

The core 105 has a central axis 101. The core 105 can optionally have a central cavity 106 for insertion of a thermal plug (not shown). Each fin 102 has a base and a tip. The base of each fin 102 is coupled to the core 105 substantially parallel to the central axis 101.

Each fin 102 may include a vertical portion 107 and an angled portion 108. The angled portion 108 of each fin 102 is bent in the same relative direction. The fins 102 of the bent fin heat sink 100 may be shaped to capture the tangential component of air from an axial flow fan (not shown). The fins 102 may also be shaped to direct a relatively large and relatively high velocity air flow to substantially the entire surface of each fin 102 including the hottest portion of each fin 102 adjacent the core 105.

After forming (e.g. by extrusion) a plurality of straight unbent fins emanating radially from core 105, the upper portion of the heat sink 100 may be counterbored to produce a counterbore 104 in which part of the base of each fin 102 is sheared from the core 105 in the vicinity only of the angled portion 108. This allows the angled portion 108 of each fin 102 to be bent in a subsequent operation.

The angle that the angled portion 108 of each fin makes with the vertical portion 107 may be approximately 150 degrees. Different angles may be used, depending upon the airflow characteristics of the particular axial flow fan being used in conjunction with the bent fin heat sink.

Instead of counterboring the upper portion of the heat sink 100, a hole saw or other tool may be utilized to make a groove in the upper portion of the heat sink 100 of sufficient depth to enable the angled portion 108 of each fin 102 to be bent. Another method of forming bent (or angled portions) will be described below.

Additionally, certain fins in the "corner" regions of the bent fin heat sink 100 may have their upper tips 109 slightly clipped to fit into a desired "semi-rectangular" footprint.

Figure 7:
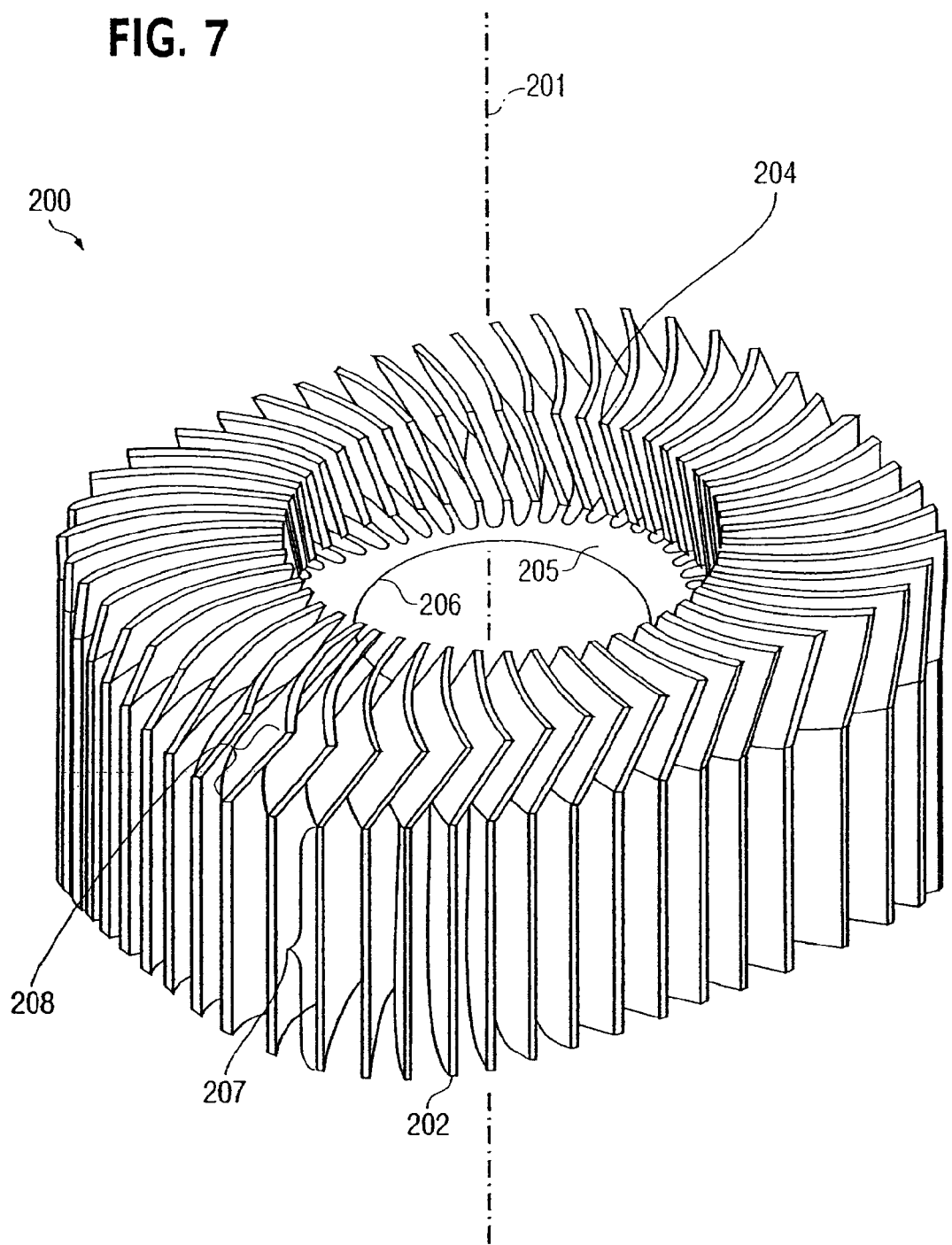
FIG. 7 illustrates a perspective view of a curved-bent fin heat sink.

FIG. 7 illustrates a perspective view of a curved-bent fin heat sink 200 according to one arrangement. Other arrangements are also possible. The curved-bent fin heat sink 200 may include a plurality of cooling fins 202 arranged about a core 205. The fins 202 may be formed of a thermally conductive metal. The fins 202 may be formed of aluminum; however, the fins 202 may also be formed of copper or any other suitable thermally conductive metal or metal alloy.

The core 205 may have a central axis 201. The core 205 may optionally have a central cavity 206 for insertion of a thermal plug (not shown). Each fin 202 may have a base and a tip. The base of each fin 202 may be coupled to the core 205 substantially parallel to the central axis 201. Each fin 202 may be curved between its base and its tip, and the curve of each fin 202 may be towards the same relative direction. In FIG. 7, each fin 202 is curved towards a counterclockwise direction, opposite to the direction of rotation of an axial flow fan to be used in conjunction with the heat sink 200.

Each fin 202 may include a vertical portion 207 and an angled portion 208. The angled portion 208 of each fin 202 may be bent in the same relative direction. The fins 202 of the curved-bent fin heat sink 200 may be shaped to capture the tangential component of air from an axial flow fan (not shown). The fins 202 may also be shaped to direct a relatively large and relatively high velocity air flow to substantially the entire surface of each fin 202, including the hottest portion of each fin 202 adjacent the core 205.

After forming a plurality of curved unbent fins emanating substantially radially from the core 205, for example using an extrusion process, the upper portion of the heat sink 200 may be counterbored to produce a counterbore 204 in which part of the base (i.e., the inner portion) of each fin 202 is sheared from the core 205 in the vicinity only of the angled portion 208. This allows the angled portion 208 of each fin 202 to be bent in a subsequent operation.

The angle that the angled portion 208 of each fin makes with the vertical portion 207 may be approximately 150 degrees. Different angles may be used depending upon the airflow characteristics of the particular axial flow fan being used in conjunction with the bent fin heat sink.

FIG. 8a illustrates a perspective view of a swept-bent fin heat sink 300 according to an example embodiment of the present invention. Other embodiments and configurations are also within the scope of the present invention. The swept-bent fin heat sink 300 may include a plurality of cooling fins 302 arranged about a core 305. The fins 302 may be formed of a thermally conductive metal. The fins 302 may be formed of aluminum; however, the fins 302 may also be formed of copper or any other suitable thermally conductive metal or metal alloy.

Figure 8B:
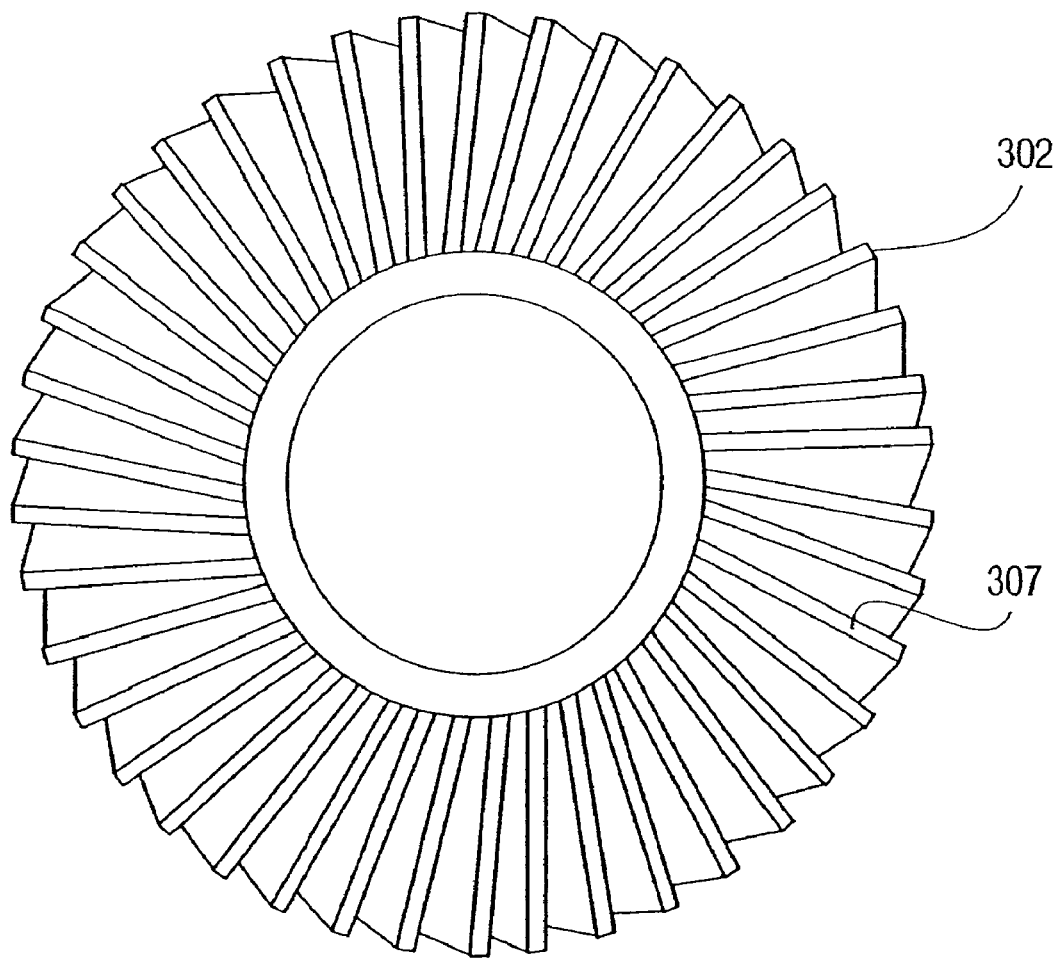
FIG. 8b illustrates a top view of a swept fin heat sink.

The core 305 may have a central axis 301. The core 305 may optionally have a central cavity 306 for insertion of a thermal plug (not shown). Each fin 302 may have a base and a tip. The base of each fin 302 may be coupled to the core 305 substantially parallel to the central axis 301. Each fin 302 may include a swept portion 307 and a bent portion 308. The swept portion 307 of each fin 302 may be swept in the same relative direction. That is, each swept fin may extend from the core 305 at approximately the same angle. To obtain the swept effect, each angle may be other than perpendicular to the core 305. In another embodiment, the angles of each of the fins extending from the core 305 may vary. FIG. 8b shows a top view of the fins 302 provided about the core 305 in a swept manner (prior to the bending operation). The bent portion 308 of each fin 302 may be bent in the same relative direction. The fins 302 may be shaped to capture the tangential component of air from an axial flow fan (not shown in FIG. 8a). The fins 302 are also shaped to direct a relatively large and relatively high velocity airflow to the surface of each fin 302, including the hottest portion of each fin 302 adjacent the core 305.

According to one embodiment of a swept-bent fin heat sink 300, after forming (e.g. by extrusion) a plurality of swept fins emanating from the core 305 (as shown in FIG. 8b), the upper portion of the heat sink 300 may be counterbored to produce a counterbore in which part of the base of each fin 302 is sheared from the core 305 in the vicinity only of the bent portion 308. This allows the bent portion 308 of each fin 302 to be bent in a subsequent operation. Rather than counterboring the upper portion of the heat sink 300, a hole saw or other tool may be utilized to make a groove in the upper portion of the heat sink 300 of sufficient depth to enable the bent portion 308 to be bent. For certain fins in the "corner" regions of the swept bent fin heat sink 300, the upper tips may be slightly clipped to fit into a desired "semi-rectangular" footprint.

Embodiments of the present invention may provide an extruded heat sink having a swept radial fin geometry, a hollow center and an angular bend in the fins. Similar to that discussed above, a cooper core may be press fitted into the hollow center for better conduction to the outer fins. The swept-bent fin heat sink may better utilize airflow coming off the fan blades for an impinging flow heat sink due to the coupling of the fan angle of attack and the bend angle of the fins. The heat sink may be modified for higher performance depending on the fan geometry. Further, the fins may be swept such that air coming off the fan may be driven towards the core.

Figure 9:
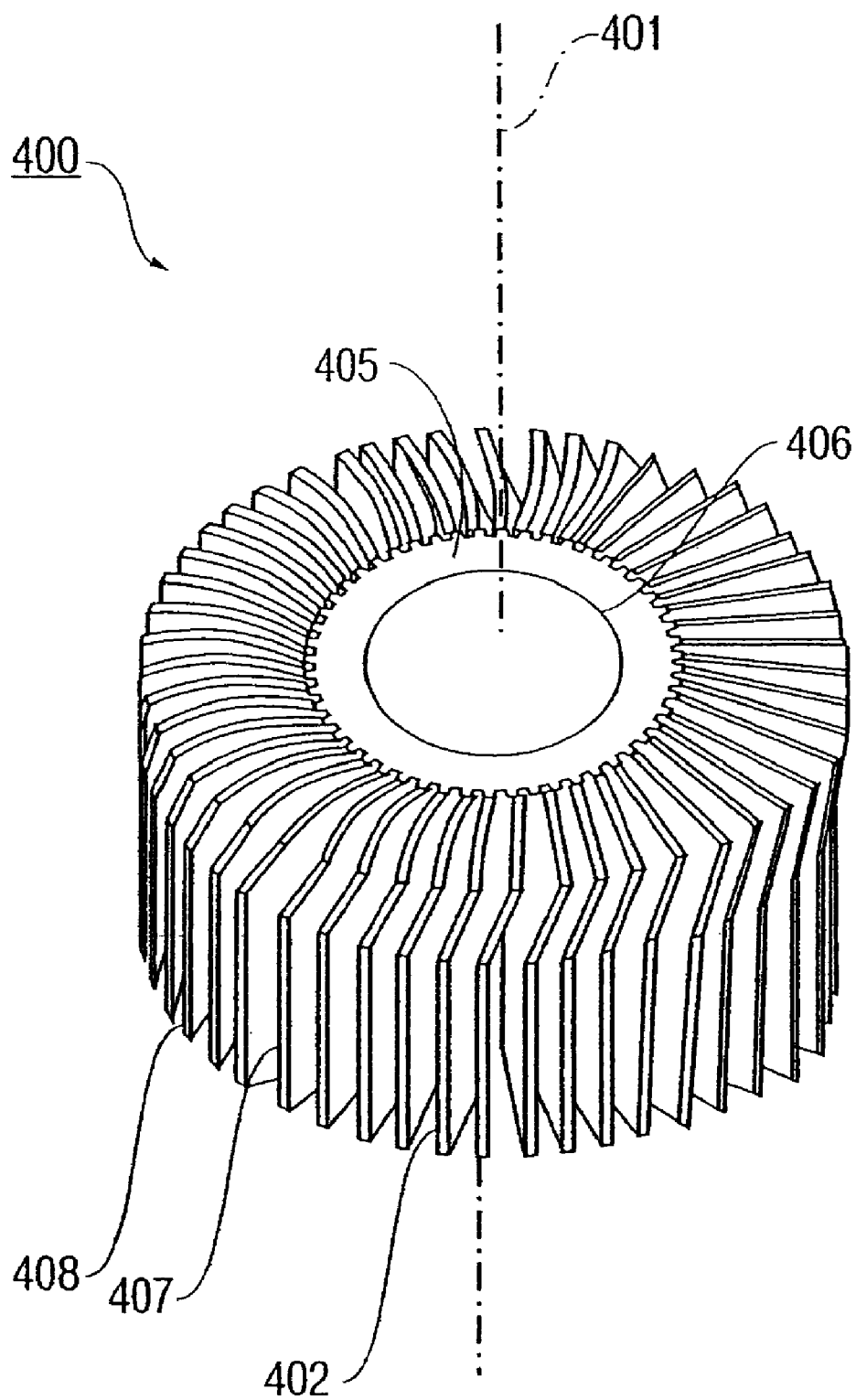
FIG. 9 illustrates a perspective view of a curved-bent fin heat sink according to an example embodiment of the present invention.

FIG. 9 illustrates a perspective view of a curved-bent fin heat sink 400 according to an example embodiment of the present invention. Other embodiments and configurations are also within the scope of the present invention. The curved-bent fin heat sink 400 may include a plurality of cooling fins 402 arranged about a core 405. The fins 402 may be formed of a thermally conductive metal. The fins 402 may be formed of aluminum; however, the fins 402 may also be formed of copper or any other suitable thermally conductive metal or metal alloy.

The core 405 may have a central axis 401. The core 405 may optionally have a central cavity 406 for insertion of a thermal plug (not shown). Each fin 402 may have a base and a tip. The base of each fin 402 may be coupled to the core 405 substantially parallel to the central axis 401. Each fin 402 to may include a curved portion 407 and a bent portion 408. The curved portion 407 of each fin 402 is curved in the same relative direction. In FIG. 9, each fin 402 is curved towards a counterclockwise direction, opposite to the direction of rotation of an axial flow fan to be used in conjunction with the heat sink. The bent portion 408 of each fin 402 may be bent in the same relative direction. The fins 402 may be shaped to capture the tangential component of air from an axial flow fan (not shown in FIG. 9). The fins 402 may also be shaped to direct a relatively large and relatively high velocity of airflow to the surface of each fin 402, including the hottest portion of each fin 402 adjacent the core 405.

According to one embodiment of the curved-bent fin heat sink 400, after forming (e.g. by extrusion) a plurality of curved fins emanating from the core 405, the upper portion of the heat sink 400 may be counterbored to produce a counterbore in which part of the base of each fin 402 is sheared from the core 405 in the vicinity only of the bent portion 408. This allows the bent portion 408 of each fin 402 to be bent in a subsequent operation. Rather than counterboring the upper portion of the heat sink 400, a hole saw or other tool may be utilized to make a groove in the upper portion of the heat sink 400 of sufficient depth to enable the bent portion 408 to be bent. For certain fins in the "corner" regions of the curved-bent fin heat sink 400, the upper tips may be slightly clipped to fit into a desired "semi-rectangular" footprint. Another method to form the bend will be described below.

Figure 10:
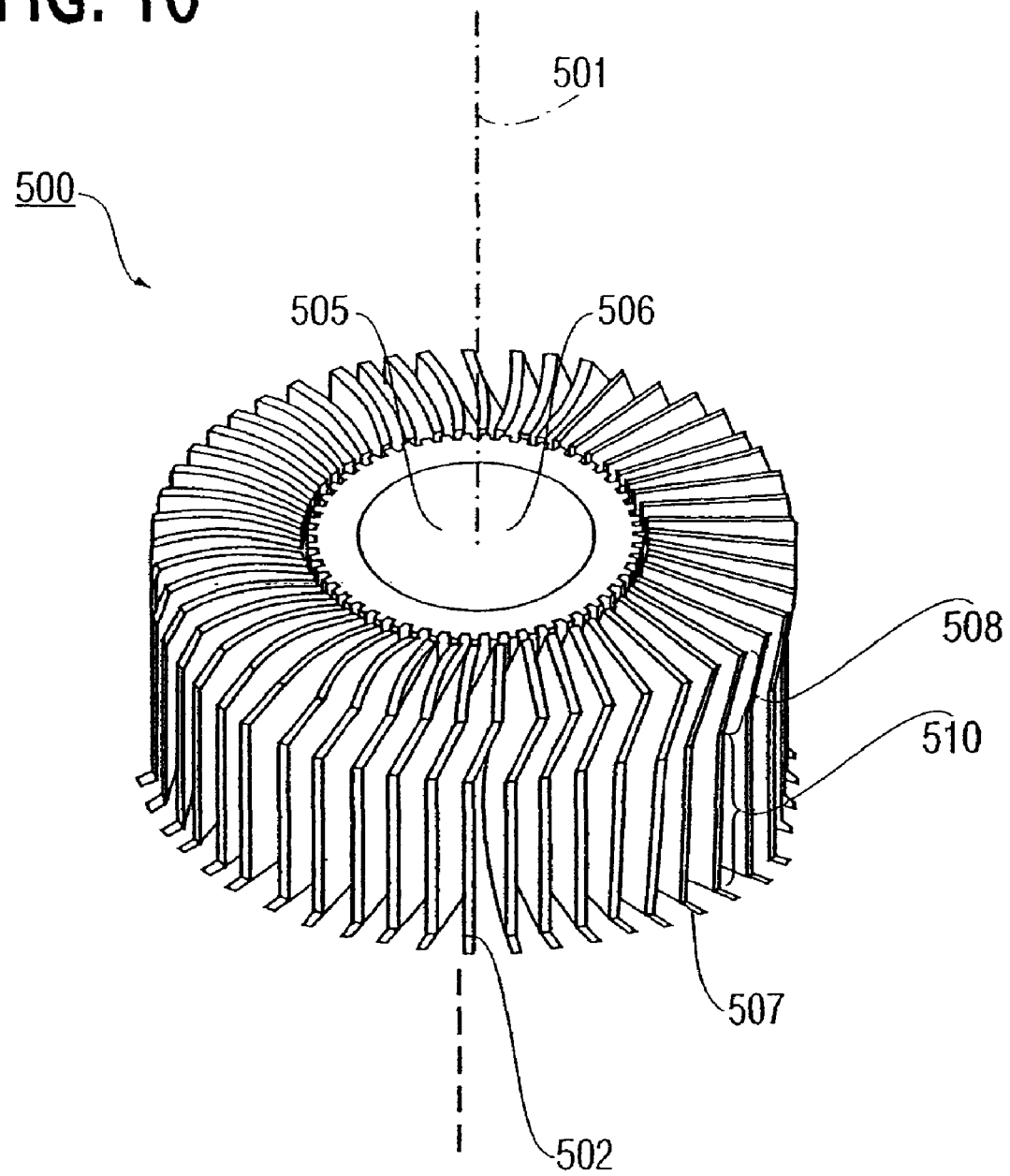
FIG. 10 illustrates a perspective view of a curved double-bent fin heat sink according to an example embodiment of the present invention.

FIG. 10 illustrates a perspective view of a curved double-bent fin heat sink 500 according to an example embodiment of the present invention. Other embodiments and configurations are also within the scope of the present invention. The curved double-bent fin heat sink 500 may include a plurality of cooling fins 502 arranged about a core 505. The fins 502 may be formed of a thermally conductive metal. The fins 502 may be formed of aluminum; however, the fins 502 may also be formed of copper or any other suitable thermally conductive metal or metal alloy.

The core 505 may have a central axis 501. The core 505 may optionally have a central cavity 506 for insertion of a thermal plug (not shown). Each fin 502 may have a base and a tip. The base of each fin 502 may be coupled to the core 505 substantially parallel to the central axis 501. Each fin 502 may include a first bent portion 507 and a second bent portion 508 on opposite ends (i.e., top and bottom) of a curved portion 510. In FIG. 10, each fin 502 is curved towards a counterwise direction, opposite to the direction of rotation of an axial flow fan to be used in conjunction with the heat sink. The first bent portion 507 of each fin 502 may be bent in the same relative direction. The second bent portion 508 of each fin 502 may be bent in the same relative direction. The fins 502 are shaped to capture the tangential component of air from an axial flow fan (not shown in FIG. 10). The fins 502 are also shaped to direct a relatively large and relatively high velocity airflow to the surface of each fin 502, including the hottest portion of each fin 502 adjacent the core 505.

According to one embodiment of a curved double-bent fin heat sink 500, after forming (e.g. by extrusion) a plurality of curved fins emanating from the core 505, the upper portion of the heat sink 500 may be counterbored to produce a counterbore in which part of the base of each fin 502 is sheared from the core 505 in the vicinity only of the second bent portion 508. Additionally, the lower portion of the heat sink 500 may be counterbored to produce a counterbore in which part of the base of each fin 502 is sheared from core 505 in the vicinity only of the first bent portion 507. This allows the first bent portion 507 and the second bent portion 508 of each fin 502 to be bent in a subsequent operation. Rather than counterboring the upper and/or lower portion of the heat sink 500, a hole saw or other tool may be utilized to make a groove in the upper and/or lower portion of the heat sink 500 of sufficient depth to enable the first bent portion 507 and the second bent portion 508 to be bent. For certain fins in the "corner" regions of the curved double-bent fin heat sink 500, the upper tips may be slightly clipped to fit into a desired "semi-rectangular" footprint.

Figure 11A:
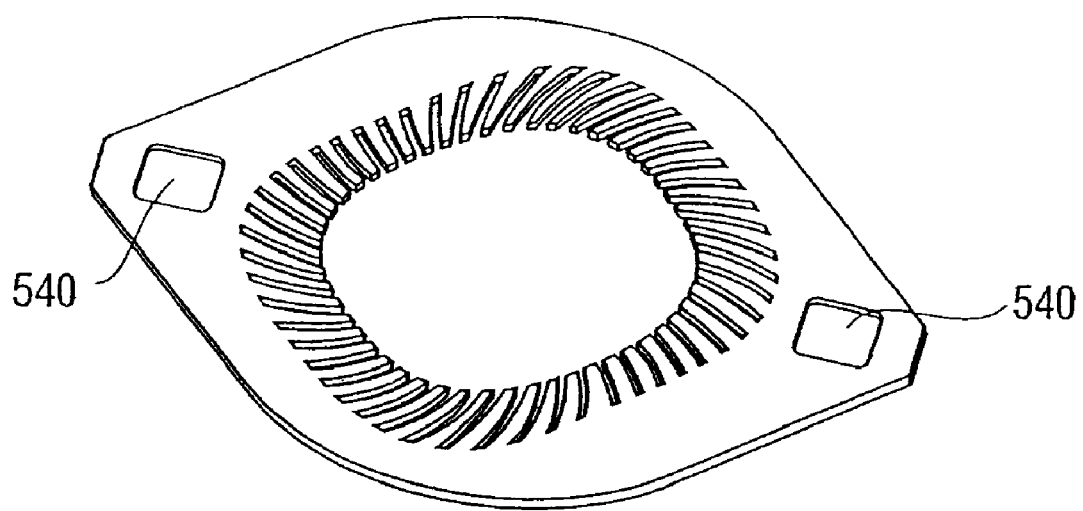
FIG. 11a illustrates a die used for fin bending according to an example embodiment of the present invention.
Figure 11B:
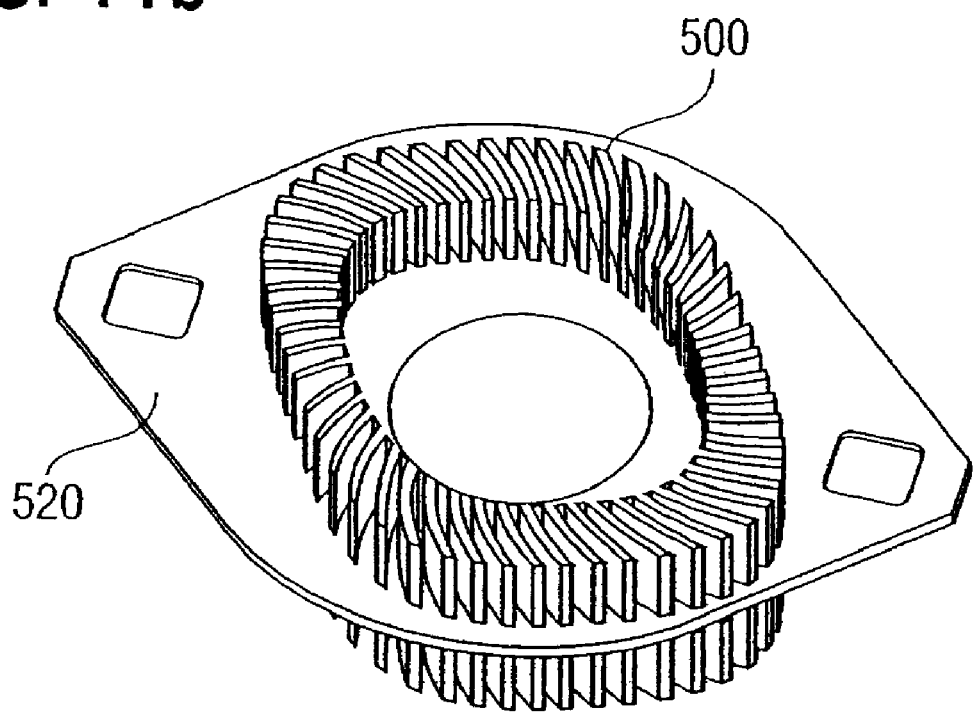
FIG. 11b illustrates a die assembled to an unbent heat sink according to an example embodiment of the present invention.

In an alternative embodiment for both the curved-bent fin heat sink (FIG. 9) and the curved double-bent fin heat sink (FIG. 10), one or two secondary bending operations may be used. To perform a first bend at the top part of the heat sink, two female dies may be used that mate with the unbent heat sink. FIG. 11a shows an example of a die 520 that may be used for fin bending. FIG. 11b shows the die 520 of FIG. 11a assembled into an unbent heat sink (such as the heat sink 500). One of the female dies may be twisted while the other die remains fixed. One of the dies engages the heat sink where the bend line will occur. The other die may contact the fins over a small area along the tops of the fins while also maintaining a fixed vertical displacement to the die so as not to dislodge while the bending operation is taking place. Once the dies are in position, one of the dies may twist over a predetermined angle, which includes the bend pattern onto the heat sink. Twisting may be accomplished by hand using levers that mount to the holes 530 and 540 on the ends of the die 520, or by using features to mate the die 520 to a spindle. This bend pattern may maximize the cooling due to its utilization of the airflow velocity component of a common axial fan.

Figure 11C:
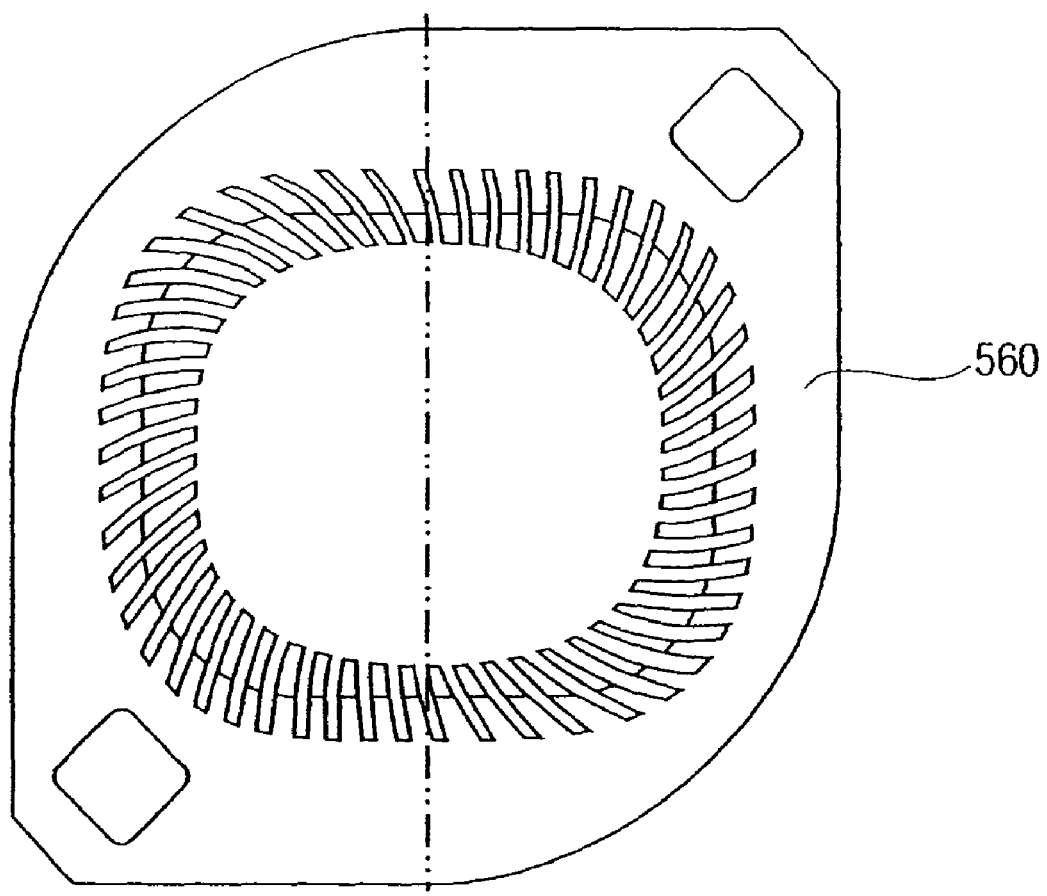
FIG. 11c illustrates a die used in a second bending operation according to an example embodiment of the present invention.

After the first bending operation is complete and the dies are removed from the heat sink, the second bending operation at the bottom of the heat sink may be performed. The second bending operation may include inserting a common expanding mandrel into the hole in the center of the heat sink core. The expanding mandrel may attach to the sides of the hole and hold the heat sink in place. FIG. 11c shows a female die 560 that may be inserted onto the base of the heat sink while the mandrel is attached to the heat sink. The die 560 may be similar to the previous dies (such as the die 520) and include a predetermined angle cut onto the die teeth that enables the bending line to be something other than perpendicular to the core. After the expanding mandrel is engaged and the die 560 is in place, the second bending operation may be achieved by twisting the mandrel and/or die 560.

According to an embodiment of a curved double-bent fin heat sink, an extruded aluminum heat sink with curved fins may have two secondary bending operations to allow the heat sink to capture and utilize the radial component of the incoming airflow that is created by impinging axial fans. The second bending operation may direct the outgoing flow to a path parallel to the motherboard and package, which reduces the backpressure that the heat sink produces by alleviating directly impinging flow onto the package motherboard. A copper core may be press fitted into the hollow cell for better conduction to the outer fins.

The heat sink may be a copper base-folded aluminum fin heat sink. An aluminum curved double-bent fin heat sink may provide better performance at a lower cost and lower mass than a folded fin heat sink. The first bending operation may involve removing a portion of the top of the core of the heat sink, enabling the bending of the upper fins at an angle that may utilize the radial component of the air coming off the fan blades more efficiently. The second bending operation may turn the air at the bottom of the heat sink to directly parallel to the motherboard/package, reducing the pressure drop and increasing heat transfer further.

Figure 12:
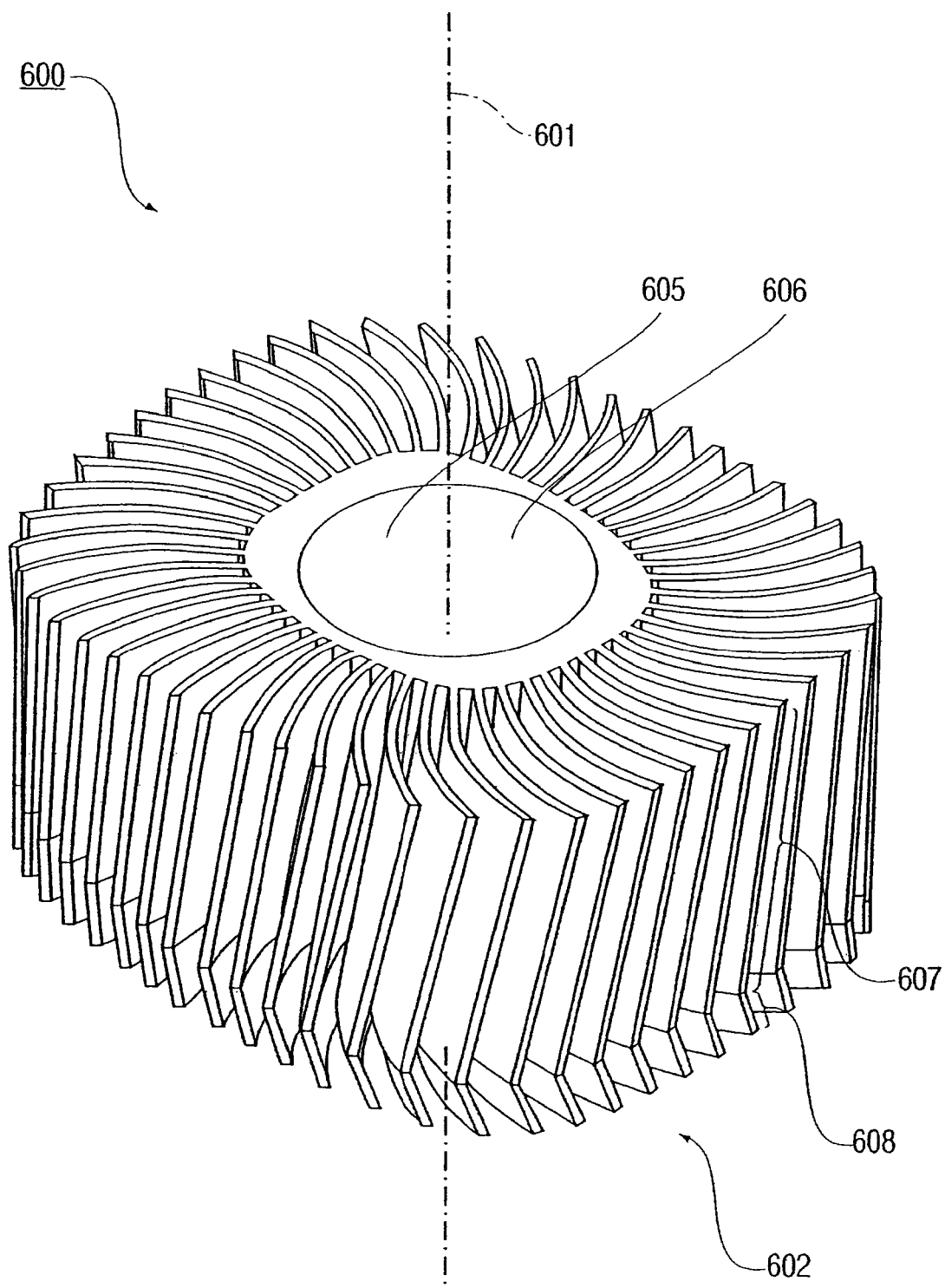
FIG. 12 illustrates a perspective view of a curved double-bent fin heat sink according to an example embodiment of the present invention.

FIG. 12 illustrated a perspective view of a curved double-bent fin heat sink 600 according to an example embodiment of the present invention. Other embodiments and configurations are also within the scope of the present invention. The curved double-bent fin heat sink 600 may include a plurality of cooling fins 602 arranged about a core 605. The fins 602 may be formed of a thermally conductive metal. The fins 602 may be formed of aluminum; however, the fins 602 may also be formed of copper or any other suitable thermally conductive metal or metal alloy.

The core 605 may have a central axis 601. The core 605 may optionally have a central cavity 606 for insertion of a thermal plug (not shown). Each fin 602 may have a base and a tip. The base of each fin 602 may be coupled to the core 605 substantially parallel to the central axis 601. Each fin 502 may be curved and further include a first bent portion 607 and a second bent portion 608. In FIG. 12, the first bent portion 607 may be an upper part of the fin 602 and the second bent portion 608 may be a lower part of the fin 602. In FIG. 12, each fin 602 is curved towards a counterwise direction, opposite to the direction of rotation of an axial flow fan to be used in conjunction with the heat sink. The first bent portion 607 of each fin 602 may be bent in the same relative direction. The second bent portion 608 of each fin 602 may be bent in the same relative direction. The fins 602 are shaped to capture the tangential component of air from an axial flow fan (not shown in FIG. 12). The fins 602 are also shaped to direct a relatively large and relatively high velocity airflow to the surface of each fin 602, including the hottest portion of each fin 602 adjacent the core 605.

Figure 13:
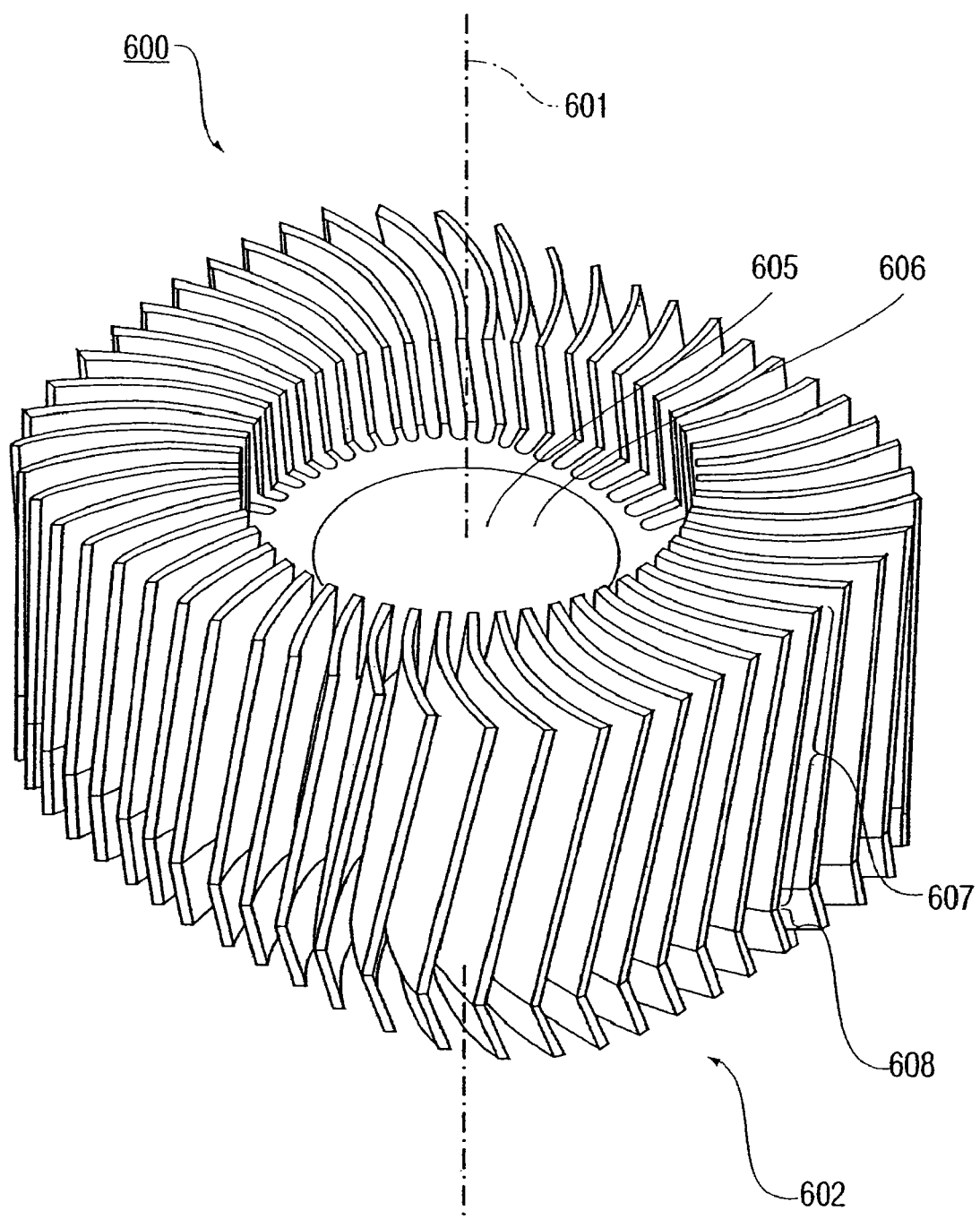
FIG. 13 illustrates a perspective view of a curved double-bent fin heat sink according to an example embodiment of the present invention.

FIG. 13 shows another example of a curved double-bent fin heat sink according to an example embodiment of the present invention. The curved double-bent fin heat sink is identical to the heat sink shown in FIG. 12 except that the heat sink in FIG. 13 does not include a counterbore within the core 605. In one embodiment, the angle that the first bent portion 607 of each fin (in both FIG. 12 and FIG. 13) makes with respect to vertical is approximately 5° to 15°. The angle that the second bent portion 608 of each fin (of FIG. 12 and FIG. 13) makes with respect to vertical is approximately 5° to 30°. Other angles for the first bent portion 607 and the second bent portion 608 are also within the scope of the present invention. That is, different angles may be used depending upon the airflow characteristics of the particular axial flow fan being used in conjunction with the heat sink.

The curved double-bent fin heat sinks shown in FIGS. 12 and 13 may be manufactured in a similar manner as described above.

Figure 14:
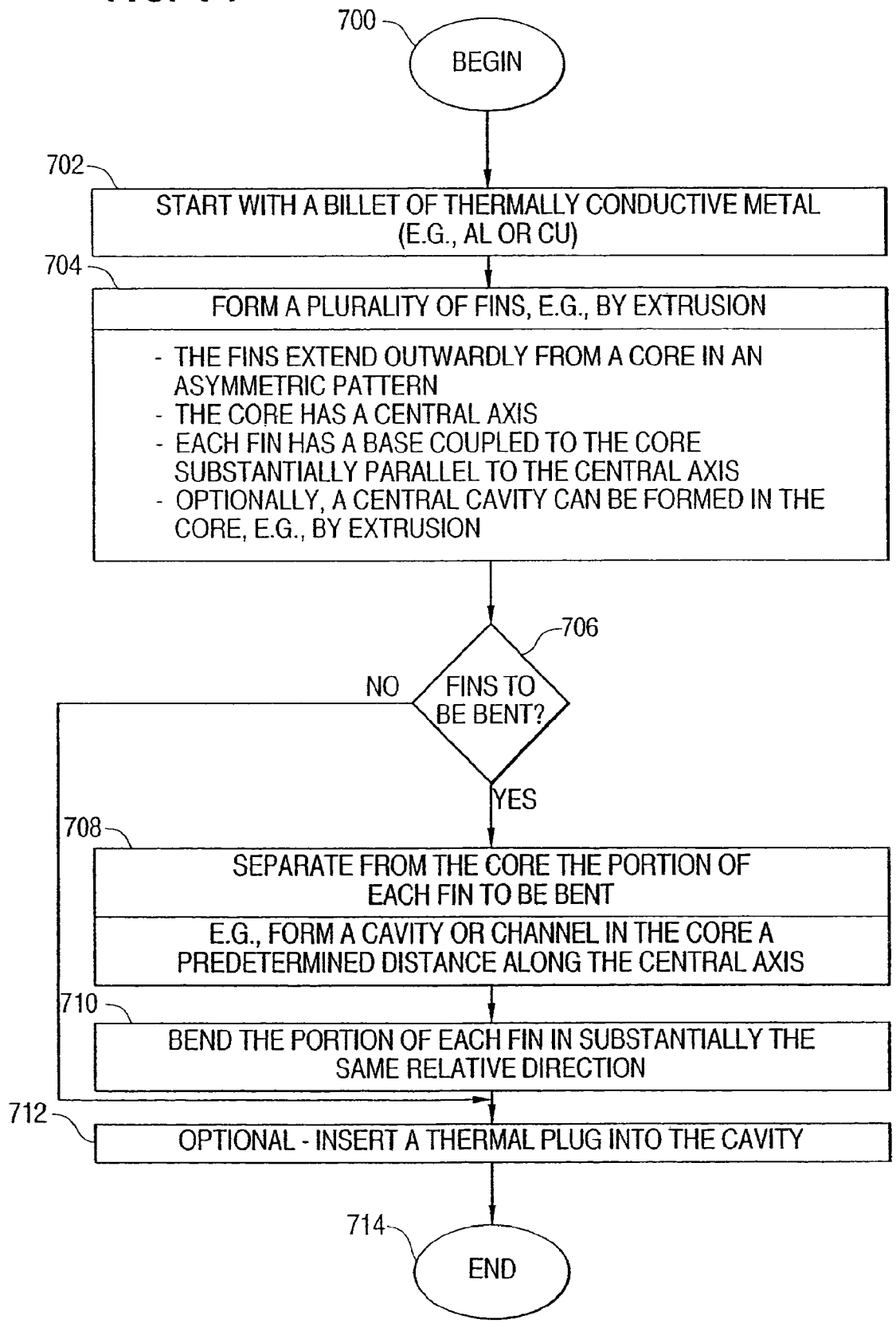
FIG. 14 illustrates a flow diagram of a method of fabricating a heat sink according to an example embodiment of the present invention.

FIG. 14 is a flow diagram of a method of fabricating a heat sink according to an example embodiment of the present invention. Other operations and orders of operations are also within the scope of the present invention. The method begins at block 700. In block 702, a billet of thermally conductive metal (such as aluminum or copper) is provided. In block 704, a plurality of fins are formed from the billet, for example by an extrusion or micro-forging process. The fins extend outwardly from a in core in a swept manner (for the swept-bent fins described above) or in another manner (such as curved) as desired. The core has a central axis, and each fin has a base that is coupled to the core substantially parallel to the central axis. If desired, a central cavity can be formed in the core. The central cavity may be formed in any suitable manner, for example as part of the extrusion operation. In block 706, if the fins are to be bent, then the flow diagram proceeds to block 708; otherwise, the flow diagram may proceed to block 712.

In block 708, the portions of the fins to be bent may be separated from the core, for example by forming a cavity (e.g. by counterboring) or channel (e.g. by machining or sawing) into the core a predetermined distance along the central axis, from the top of the heat sink. A portion of each fin may be bent in substantially the same relative direction in block 710. In block 712, a thermal plug may be inserted into the central cavity to provide increased thermal dissipation from the IC through the heat sink core to the heat sink fins. The flow diagram ends at block 714.

FIG. 15 illustrates a flow diagram of a method of fabricating an electronic assembly according to an example embodiment of the invention. Other operations and orders of operations are also within the scope of the present invention. The method begins at block 800. In block 802, an electronic component is mounted on a circuit board. An axial flow fan may be provided in block 804. The axial flow fan is capable of moving air having a component normal to the electronic component and a component tangential to the electronic component. A heat sink may be mounted between the electronic component and the axial flow fan in block 806. The heat sink may include a number of cooling fins that are arranged about a core having a central axis. Each cooling fin has a base coupled to the core substantially parallel to the central axis. The cooling fins are shaped to capture both components of air, i.e. the axial component and the tangential component. A first face of the heat sink is in thermal contact with the electronic component and may have a semi-rectangular periphery. A second face of the heat sink faces the fan and may have a semi-rectangular periphery. The second face is substantially opposite the first face. The core is shaped to maximize the number of cooling fins while maintaining a substantially uniform aspect ration in the cooling fins. The method ends at 808.

The operations described above with respect to FIGS. 14 and 15 may also be performed in a different order from those described herein. Also, although the flow diagrams of FIGS. 14 and 15 are shown as having a beginning and an end, they can be performed continuously.

FIG. 16 is a block diagram of an electronic system 901 incorporating at least one electronic assembly 902 with a heat sink accordance to an example embodiment of the present invention. Other embodiments and configurations are also within the scope of the present invention. An electronic system 901 is one example of an electronic system in which embodiments of the present invention may be used. In this example, the electronic system 901 includes a data processing system having a system bus 904 to couple the various components of the system. The system bus 904 provides communications links among the various components of the electronic system 901 and may be implemented as a single bus, as a combination of busses, or in any other suitable manner.

An electronic assembly 902 may be coupled to the system bus 904. The electronic assembly 902 may include any circuit or combination of circuits. In one embodiment, the electronic assembly 902 includes a processor 906 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in the electronic assembly 902 are a chip set 907 and a communications circuit 908. The chip set 907 and the communications circuit 908 may be functionally coupled to the processor 906, and they may be configured to perform any of a wide number of processing and/or communications operations. Other possible types of circuits (not shown) that could be included within the electronic assembly 902 include a digital switching circuit, a radio frequency (RF) circuit, a memory circuit, a custom circuit, an application-specific integrated circuit (ASIC), an amplifier, or the like.

The electronic system 901 may also include an external memory 912, which in turn can include one or more memory elements suitable to the particular application, such as a main memory 914 in the form of random access memory (RAM), one or more hard drives 916, and/or one or more drives that handle removable media 918 such as floppy diskettes, compact disks (CDs), digital video disks (DVDs), and the like.

The electronic system 901 may also include a display device 909, one or more speakers 910, and a keyboard and/or controller 920, which can include a mouse, trackball, game controller, voice-recognition device, or any other device that permits a system user to input information into and receive information from the electronic system 901.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed:

1. A heat sink comprising:
a core having a central axis; and
a plurality of cooling fins each having a base and a tip, the plurality of cooling fins each including first and second bent portions,
wherein the bent portions are located on opposite ends of a middle portion, the middle portion is substantially parallel to the central axis and the second bent portions are bent in the same relative direction for one-half of the fins, and bent in a counter direction for the other half of the fins.

2. The heat sink recited in claim 1, wherein the core has a central cavity configured to receive a thermal plug.

3. The heat sink recited in claim 1, wherein the base of each fin may be coupled to the core substantially parallel to the central axis.

4. The heat sink recited in claim 1, wherein the plurality of cooling fins are each curved in a direction opposite to the direction of rotation of air from an axial flow fan.

5. The heat sink recited in claim 1, wherein the first bent portions are bent in the same relative direction.

6. The heat sink recited in claim 1, wherein the second bent portions are bent in the same relative direction.

7. The heat sink recited in claim 1, wherein the plurality of fins are each shaped to capture a tangential component of air from an axial flow fan.

8. The heat sink recited in claim 1, wherein the plurality of fins are each shaped to direct a relatively large and relatively high velocity airflow to a surface of each fin.

* * * * *